(12) United States Patent
Kim et al.

(10) Patent No.: US 10,833,095 B2
(45) Date of Patent: *Nov. 10, 2020

(54) SINGLE POLY NON-VOLATILE MEMORY DEVICE, METHOD OF MANUFACTURING THE SAME AND SINGLE POLY NON-VOLATILE MEMORY DEVICE ARRAY

(71) Applicant: MagnaChip Semiconductor, Ltd., Cheongju-si (KR)

(72) Inventors: Su Jin Kim, Cheonan-si (KR); Hye Jin Yoo, Sejong (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/256,137

(22) Filed: Jan. 24, 2019

(65) Prior Publication Data
US 2019/0172834 A1    Jun. 6, 2019

Related U.S. Application Data

(62) Division of application No. 15/402,259, filed on Jan. 10, 2017, now Pat. No. 10,236,297.

(30) Foreign Application Priority Data

Jan. 15, 2016  (KR) .......................... 10-2016-0005621

(51) Int. Cl.
| | | |
|---|---|---|
| *G11C 16/04* | (2006.01) | |
| *H01L 27/11558* | (2017.01) | |
| *H01L 27/11524* | (2017.01) | |
| *H01L 29/788* | (2006.01) | |
| *G11C 16/10* | (2006.01) | |
| *G11C 16/14* | (2006.01) | |
| *H01L 29/66* | (2006.01) | |
| *H01L 29/08* | (2006.01) | |
| *H01L 29/10* | (2006.01) | |

(52) U.S. Cl.
CPC .... *H01L 27/11558* (2013.01); *G11C 16/0408* (2013.01); *G11C 16/0433* (2013.01); *G11C 16/10* (2013.01); *G11C 16/14* (2013.01); *H01L 27/11524* (2013.01); *H01L 29/0847* (2013.01); *H01L 29/1095* (2013.01); *H01L 29/66825* (2013.01); *H01L 29/7883* (2013.01); *G11C 2216/10* (2013.01)

(58) Field of Classification Search
CPC ...................... G11C 16/0408; H01L 27/11558
USPC ................................................... 365/185.29
See application file for complete search history.

(56) References Cited

U.S. PATENT DOCUMENTS

| | | | |
|---|---|---|---|
| 7,663,173 B1 | 2/2010 | Desai et al. | |
| 7,869,279 B1 | 1/2011 | Ratnakumar | |
| 8,004,032 B1 * | 8/2011 | Bu ................... | H01L 29/42332 257/315 |

(Continued)

*Primary Examiner* — Muna A Techane
(74) *Attorney, Agent, or Firm* — NSIP Law

(57) ABSTRACT

A single poly non-volatile memory device that includes: a first type lower well; first and second wells separately formed in an upper portion of the first type lower well; a source electrode, a selection transistor, a sensing transistor, and a drain electrode sequentially disposed in an upper portion of the first well. A control gate is formed in an upper portion of the second well with separated on an opposite side of the source electrode from the first well and connected to the gate of the sensing transistor.

16 Claims, 17 Drawing Sheets

(56) References Cited

U.S. PATENT DOCUMENTS

| | | | |
|---|---|---|---|
| 9,805,806 B2 | 10/2017 | Chen et al. | |
| 10,236,297 B2* | 3/2019 | Kim | H01L 27/11558 |
| 2007/0171718 A1* | 7/2007 | Hemink | G11C 11/5628 |
| | | | 365/185.14 |
| 2008/0253186 A1* | 10/2008 | Lee | G11C 11/5671 |
| | | | 365/185.17 |
| 2008/0266959 A1 | 10/2008 | Haggag et al. | |
| 2009/0267127 A1 | 10/2009 | Chen et al. | |
| 2010/0157669 A1* | 6/2010 | Audzeyeu | H01L 27/115 |
| | | | 365/185.1 |
| 2010/0157690 A1 | 6/2010 | Jung | |
| 2010/0302854 A1 | 12/2010 | Wu et al. | |
| 2011/0032766 A1* | 2/2011 | Fang | G11C 16/28 |
| | | | 365/185.18 |

* cited by examiner

SINGLE POLY NON-VOLATILE MEMORY DEVICE, METHOD OF MANUFACTURING THE SAME AND SINGLE POLY NON-VOLATILE MEMORY DEVICE ARRAY

CROSS-REFERENCE TO RELATED APPLICATION

This application is a division of application Ser. No. 15/402,259 filed on Jan. 10, 2017, which claims the benefit under 35 USC 119 of Korean Patent Application No. 10-2016-0005621, filed on Jan. 15, 2016, in the Korean Intellectual Property Office, the entire disclosure of which is incorporated herein by reference for all purposes.

BACKGROUND

1. Field

This disclosure relates to a single poly non-volatile memory device, and more particularly, to a single poly non-volatile memory device and a method of manufacturing and arranging the same that improve operation efficiency and reduce an area by disposing a sensing transistor and a selection transistor at one well and a control gate at another well.

2. Description of Related Art

A non-volatile memory device may be referred to as a Non Volatile Memory (NVM) and can stably store data for a long period without power. Representative nonvolatile memory devices include flash memory device and an Electrical Erasable Programmable Read-Only Memory (EE-PROM) devices. An EEPROM can electrically erase and restore data stored therein through conversion of an erasable programmable read-only memory (EPROM). Therefore, the non-volatile memory device is conveniently used in an application field requiring to restore a program and may store or erase data by electrically changing electric charges of an element constituting a chip. Because the non-volatile memory device can electrically read or store data, the non-volatile memory device may be programed again in a state embedded in a system and is thus used in an application field requiring information change of a user.

In general, an EEPROM uses a double poly structure that stacks two polys or a single poly structure using one poly, and the present invention relates to a single poly non-volatile element using one poly. The single poly non-volatile element may be formed without a separate high voltage process or high voltage element using a method of applying $+V_{PP}$ and $-V_{PP}$ upon performing a program or erase operation. That is, by changing a medium voltage device to a single poly non-volatile memory device without a high voltage process or a high voltage element and by constituting a circuit with the medium voltage device, the single poly non-volatile element may be compatible with a logic process. Thereby, there is a merit that a production step reduces and thus a cost reduces and a production time is shortened.

In a conventional single poly non-volatile memory device, a tunneling area and a sensing transistor are implemented in a separated structure to increase an area of a memory cell. Further, in the conventional art, the sensing transistor is disposed at a periphery of a source electrode, and by a depletion area according to PN junction, a substantial tunneling area reduces. That is, in the conventional art, upon performing an erase operation, by reducing the number of electrons injected or discharged through the sensing transistor, there is a problem that efficiency of the erase operation reduces.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a single poly non-volatile memory device includes: a first type lower well; first and second wells separately formed in an upper portion of the first type lower well; a source electrode, a selection transistor, a sensing transistor, and a drain electrode sequentially disposed in an upper portion of the first well; and a control gate formed in an upper portion of the second well with separated on an opposite side of the source electrode from the first well and connected to the gate of the sensing transistor.

The gate of the sensing transistor may further include a tunneling area that provides a moving passage of electrons toward the lower end thereof.

The single poly non-volatile memory device may further include: a first active area including the selection transistor and the sensing transistor; and a second active area including the control gate with separated from the first active area.

The control gate may be connected to the gate of the sensing transistor, and the control gate and the gate of the sensing transistor may form a floating gate.

The single poly non-volatile memory device may further include first to third doping layers disposed in an upper portion of the first well and formed adjacent to the selection transistor and the sensing transistor.

The single poly non-volatile memory device may further include a first diffusion area disposed at a lower portion of the source electrode and adjacent to the first doping layer.

The second doping layer may share a drain area of the selection transistor and a source area of the sensing transistor.

The third doping layer may correspond to a drain area of the sensing transistor, be disposed on an opposite side of the selection transistor, and include a drain electrode in an upper portion thereof.

The single poly non-volatile memory device may further include: a control gate electrode formed at one side of the control gate in an upper portion of the second well; and a second diffusion area implemented into a single area in a lower portion of the control gate electrode.

The second active area may include an entire area of the control gate and the control gate electrode to improve operation efficiency of the control gate.

The second active area may further include an implant area formed in an upper portion of the second well to be disposed at the lower end of the control gate.

Program and erase operation voltages may be applied through the source electrode and the control gate.

A negative voltage may be applied to the source electrode and a positive voltage may be applied to the control gate, upon a program operating, and a positive voltage may be applied to the source electrode and a negative voltage may be applied to the control gate, upon an erase operates.

In accordance with another general aspect, a method of manufacturing a single poly non-volatile memory device includes: forming a first type lower well by doping first type impurities in a semiconductor substrate; forming first and second wells separated in an upper portion of the first type lower well and forming a first type well to enclose each of the first and second wells by doping second type impurities; and forming a selection transistor and a sensing transistor in an upper portion of the first well and simultaneously forming a control gate in an upper portion of the second well separated on an opposite side of the source electrode from the first well.

The selection transistor and the sensing transistor may be formed in a first active area and may include a gate of the sensing transistor and a gate of the selection transistor.

The control gate and the gate of the sensing transistor may be connected.

The method may further include forming a second doping layer that shares a drain area of the selection transistor and a source area of the sensing transistor.

In accordance with another general aspect, a single poly non-volatile memory device array, includes one cell may be formed with a selection transistor, a sensing transistor, and a control gate is formed in an array form to share a control gate and a source electrode of an adjacent selection transistor, and wherein program and erase operation voltages are applied to the control gate and the source electrode of the selection transistor.

A single poly non-volatile memory device to be a target of program or erase may be selected from the single poly non-volatile memory device array, and a programming voltage may be applied to the selected at least one single poly non-volatile memory device, and wherein a portion of the programming voltage may be applied to unselected single poly non-volatile memory devices in order to minimize a voltage difference applied to the unselected single poly non-volatile memory devices among the plurality of single poly non-volatile memory devices upon performing the program or erase operation. A portion of the programming voltage applied to the unselected single poly non-volatile memory devices may correspond to ⅓ of the programming voltage.

In a general aspect, a single poly non-volatile memory device may include a first type lower well; first and second wells enclosed in the first type lower well and separated from each other; a source electrode, a selection transistor, a sensing transistor, and a drain electrode sequentially disposed in the first well. The single poly non-volatile memory device also includes a control gate formed in the second well with separated on an opposite side of the source electrode from the first well and connected to a gate of the sensing transistor. Program and erase operation voltages are applied to the control gate and the source electrode of the selection transistor.

A single poly non-volatile memory device may a target of program or erase and may be selected from the single poly non-volatile memory device array, and a programming voltage may be applied to the selected single poly non-volatile memory device. A portion of the programming voltage may be applied to unselected single poly non-volatile memory devices minimizing a voltage difference applied to the unselected single poly non-volatile memory devices among the single poly non-volatile memory devices upon performing the program or erase operation.

A portion of the programming voltage applied to the unselected single poly non-volatile memory devices corresponds to ⅓ of the programming voltage.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

An exemplary embodiment is merely an exemplary embodiment for a structural or functional description and thus it should not be analyzed that the scope of the present invention is limited by an exemplary embodiment described in a detailed description.

A meaning of terms described in an exemplary embodiment should be understood as follows. A term such as "first" and "second" is used for distinguishing a constituent element from another constituent element.

When it is described that a constituent element is "connected" or "electrically connected" to another constituent element, the element may be "directly connected" or "directly electrically connected" to the other constituent elements or may be "connected" or "electrically connected" to the other constituent elements through a third element. However, when it is described that a constituent element is "directly connected" or "directly electrically connected" to another constituent element, no element may exist between the element and the other element. Expressions, i.e., "between" and "immediately between" or "adjacent to" and "directly adjacent to" describing a relationship between constituent elements should be similarly analyzed.

Singular forms used here include a plurality of forms unless phrases explicitly represent an opposite meaning, and a term of "comprising" or "having" used in a specification embodies a characteristic, number, step, operation, element, component, or combination thereof and does not exclude presence or addition of another characteristic, number, step, operation, element, component, or combination thereof.

Figure 1A:
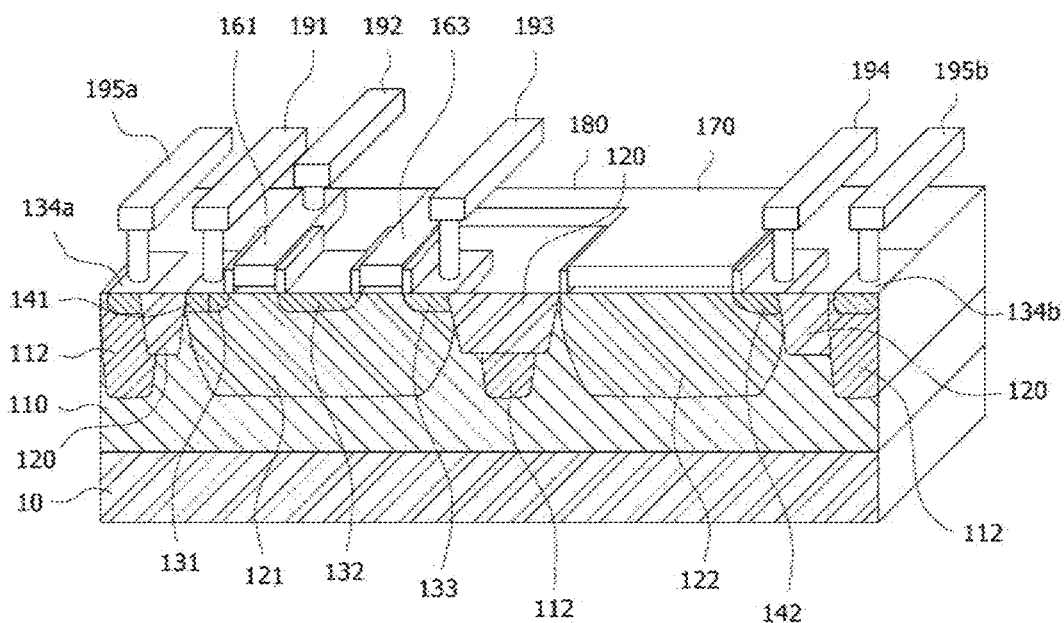
FIGS. 1A and 1B are perspective views illustrating a single poly non-volatile memory device according to an example.
Figure 1B:
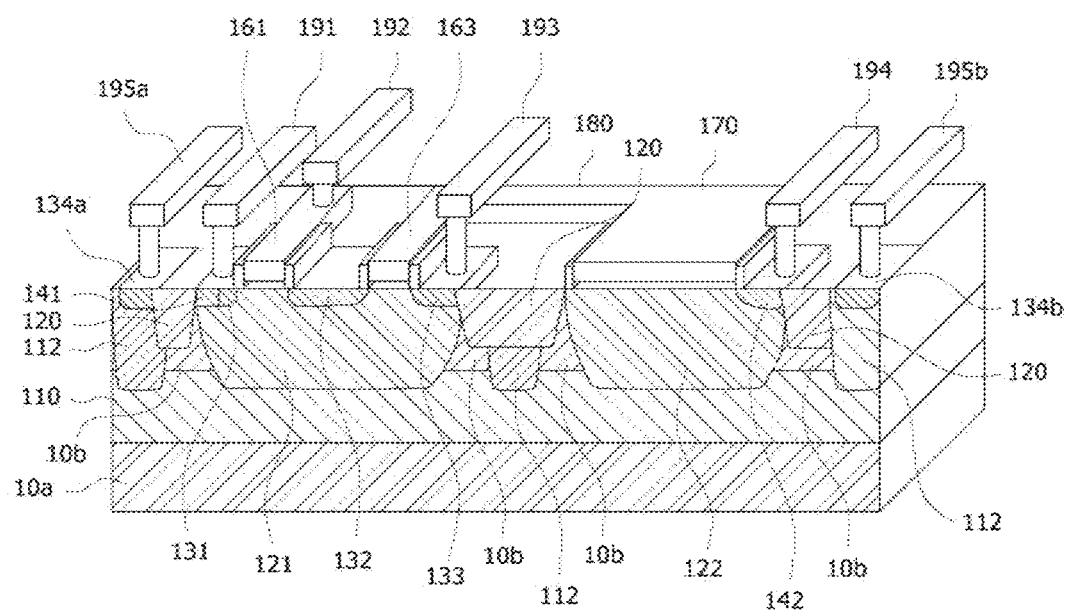

FIGS. 1A and 1B are perspective views illustrating a single poly non-volatile memory device according to an example.

Generally, memory devices may be manufactured using well known deposition methods. The most common deposition processes include, but not limited to, filament evaporation, electron-beam evaporation, flash evaporation, induction evaporation, and sputtering. The synthesis of n-type semiconductors may involve the use of vapor-phase epitaxy. Further, structures may be formed in various layers of a semiconductor using masks, etching and ablating processes. Also, doping may be used to introduce impurities into semiconductor for the purpose of modulating its electrical properties.

Referring to FIGS. 1A and 1B, a single poly non-volatile memory device 100 that may include a second type substrate 10, a first type lower well 110, an insulating layer 120, first and second wells 121 and 122, first to third doping layers 131, 132, and 133, first and second diffusion areas 141 and 142, a control gate 170, a floating gate 180, and a control gate electrode 194.

In the single poly non-volatile memory device 100, a production step and a mask added by improving from a conventional double poly structure into a single poly structure using one poly can be simplified. That is, the single poly non-volatile memory device 100 can have an advantage of cost reduction and production time reduction. It is characterized that the single poly non-volatile memory device 100 according to the present example is changed from a medium voltage device of a basic logic process for producing a semiconductor chip to be compatible with a logic process.

The second type substrate 10 may correspond to a base of the single poly non-volatile memory device 100. In an example, the second type substrate 10 may be implemented into a P type substrate. The second type substrate 10 is formed in a lowermost portion of the single poly non-volatile memory device 100.

In FIG. 1A, the first type lower well 110 may be formed on the second type substrate 10. By doping and diffusing first type impurities in the second type substrate 10, the first type lower well 110 may be formed from an upper portion of the lower well 110 to a surface of an active area.

By doping first type or second type impurities in the first type lower well 110, a first type well 112 or the first and second wells 121 and 122 may be formed.

The first and second wells 121 and 122 may be separately formed in an upper portion of the first type lower well 110. The first and second wells 121 and 122 each may correspond to a first or second active area. The first or second active area may be separated by the insulating layer 120. In an example, the insulating layer 120 may be formed with Shallow Trench Isolation (STI) or Local Oxidation of Silicon (LOCOS). Further, the first and second wells 121 and 122 may be formed by separately doping second type impurities. In an example, the first well 121 and the second well 122 may be formed in a predetermined depth in a separated area of an upper portion of the first type lower well 110 and may be implemented into a P type well.

The first type well 112 may be formed to separate the first and second wells 121 and 122. The first type well 112 may be disposed to enclose each of the first and second wells 121 and 122 in an upper portion of the first type lower well 110. That is, because the first and second wells 121 and 122 each are enclosed through the first type lower well 110 and the first type well 112, the first and second wells 121 and 122 may be separated from each other. In an example, in order to separate the first and second wells 121 and 122, the first type well 112 may be formed by doping first type impurities to enclose each of the first and second wells 121 and 122. The first type well 112 may be formed in a predetermined depth in an upper portion of the first type lower well 110 and may be implemented into an N type well. In an example, the first type lower well 110 may be formed in an upper portion of the second type substrate 10 and may be implemented into an N-lower well layer.

In FIG. 1B, the first type lower well 110 may be formed in a portion of the second type substrate 10. The first type lower well 110 may be formed by doping first type impurities in a portion of the second type substrate 10, and the first type lower well 110 may be vertically enclosed by the second type substrate 10. That is, a portion 10a of the second type substrate 10 may be disposed in a lower portion of the first type lower well 110, and another portion 10b of the second type substrate 10 may be disposed at an upper portion of the first type lower well 110. The first type well 112 or the first and second wells 121 and 122 may be formed by doping first type or second type impurities in a portion 10b of the second type substrate 10.

By locating the first to third doping layers 131, 132, and 133 within the first well 121, the first to third doping layers 131, 132, and 133 may form a source and a drain of the selection transistor and the sensing transistor. More specifically, the first doping layer 131 is formed in a portion adjacent to a gate 161 of the selection transistor, the second doping layer 132 is formed between the gate 161 of the selection transistor and a gate 163 of the sensing transistor, and the third doping layer 133 is formed in a portion adjacent to the gate 163 of the sensing transistor. Here, the second doping layer 132 becomes a source area of the sensing transistor as well as a drain area of the selection transistor.

The first to third doping layers 131, 132, and 133 may be formed in a predetermined depth in an upper portion of the first well 121. In an example, the first to third doping layers 131, 132, and 133 may be implemented into an N+ doping layer by injecting a high concentration of ions. In order to form a predetermined depth, in the first to third doping layers 131, 132, and 133, a dose amount and energy of ion injection may be adjusted.

A fourth doping layer 134 may be formed in an upper portion of the first type well 112. More specifically, the fourth doping layers 134a and 134b each may be disposed in an upper portion of the first type well 112 to be formed at both sides of the single poly non-volatile memory device 100. In an example, the fourth doping layers 134a and 134b may be implemented into an N+ doping layer by injecting a high concentration of ions. In order to form a predetermined depth, in the fourth doping layers 134a and 134b, a dose amount and energy of ion injection may be adjusted.

The first diffusion area 141 may be formed at one side of an upper portion of the first well 121. More specifically, the first diffusion area 141 may be disposed at a lower portion of a source electrode 191 and may contact with the first doping layer 131. The first diffusion area 141 may be formed by doping second type impurities. In an example, the first diffusion area 141 may be implemented into a P+ doping layer by injecting a high concentration of ions.

The second diffusion area 142 may be formed at one side of an upper portion of the second well 122. More specifically, the second diffusion area 142 may be implemented into a single area in a lower portion of the control gate electrode 194. The second diffusion area 142 may be formed in a second active area together with the control gate 170. In an example, the second diffusion area 142 may be formed by doping second type impurities and may be implemented into a P+ doping layer by injecting a high concentration of ions.

In the first active area 141, the selection transistor and the sensing transistor may be included. More specifically, the selection transistor and the sensing transistor may be disposed at an upper portion of the first well 121, and the source electrode 191, the gate 161 of the selection transistor, the gate 163 of the sensing transistor, and a drain electrode 193 may be sequentially disposed.

The selection transistor may be formed at an upper end portion between the first and second doping layers 131 and 132 and may be connected to a selection gate electrode 192. The selection transistor may be turned on or turned off through a voltage applied to the selection gate electrode 192. In an example, when the selection transistor is turned on, the sensing transistor may divide data into 0 or 1 according to a program or erase state. In another example, the selection transistor may block leakage from flowing in an over erase state.

The sensing transistor may be implemented into a tunneling area that provides a moving passage of electrons toward the lower end thereof. More specifically, the sensing transistor may be tunneled according to a voltage difference between the control gate electrode 194 and the source electrode 191.

In an example, a second insulating layer 164 may be formed in an appropriate thickness for generating tunneling. First and second insulating layers 162 and 164 may be implemented in the same thickness, but a thickness of the first and second insulating layers 162 and 164 is not limited thereto.

The control gate 170 may be separated on an opposite side of the source electrode 191 from the first well 121 to be formed at an upper portion of the second well 122 and may be connected to the gate 163 of the sensing transistor. More specifically, the control gate 170 may be connected to the gate 163 of the sensing transistor through the floating gate 180 formed at the same plane thereof.

The floating gate 180 may include the sensing transistor 163 and the control gate 170. More specifically, a portion of the floating gate 180 formed at an upper portion of the first well 121 may correspond to the gate 163 of the sensing transistor, and another portion of the floating gate 180 formed at an upper portion of the second well 122 may correspond to the control gate 170. That is, the sensing transistor 163 and the control gate 170 may be connected through the floating gate 180.

The floating gate 180 may charge or discharge electric charges according to a voltage applied to the control gate electrode 194 and the source electrode 191. In an example, the floating gate 180 may charge electric charges to program data and may discharge electric charges to erase data.

The source electrode 191 may be disposed at an upper portion of the first diffusion area 141 and the first doping layer 131. More specifically, the source electrode 191 provides a voltage for performing program-erase through the first diffusion area 141 and the first doping layer 131. More specifically, the source electrode 191 and the control gate electrode 194 may provide an operation voltage for performing program-erase and program or erase data according to the operation voltage.

The selection gate electrode 192 may be formed at an upper portion of the gate 161 of the selection transistor to turn on or turn off the selection transistor 161. Further, the selection transistor may prevent leakage of the over erased sensing transistor.

The drain electrode 193 may be formed at an upper portion of the third doping layer 133 to be disposed on an opposite side of the selection transistor based on the sensing transistor. In an example, the drain electrode 193 may be implemented into a bit line. The single poly non-volatile memory device 100 may measure an electric charge amount charged or discharged in the floating gate 180 to read data. That is, while a voltage is applied to the drain electrode 193 and the source electrode 191, when the selection transistor is turned on, the single poly non-volatile memory device 100 may read data.

The control gate electrode 194 may be connected to the second diffusion area 142 formed at an upper portion of the second well 122 and may be formed at one side of the control gate 170. More specifically, the control gate electrode 194 may perform a program-erase operation through the second diffusion area 142.

In an example, the single poly non-volatile memory device 100 may apply +6.5V to the control gate electrode 194 and apply −6.5V to the source electrode 191 to program data with an FN tunneling method. More specifically, electrons may be tunneled in a lower portion of the sensing transistor by a potential difference between the control gate electrode 194 and the source electrode 191. When a potential between the control gate electrode 194 and the source electrode 191 corresponds to a positive voltage, electrons may be injected into the floating gate 180. That is, the single poly non-volatile memory device 100 may inject electrons into the floating gate 180 through the sensing transistor to program data.

In another example, the single poly non-volatile memory device 100 may apply −6.5V to the control gate electrode 194 and apply +6.5V to the source electrode 191 to erase data with a Fowler Nordheim (FN) tunneling method. More specifically, electrons may be tunneled in a lower portion of the sensing transistor by a potential difference between the source electrode 191 and the control gate electrode 194. When a potential between the control gate electrode 194 and the source electrode 191 corresponds to a negative voltage, the floating gate 180 may discharge electrons. That is, the single poly non-volatile memory device 100 may discharge electrons of the floating gate 180 toward the first well 121 through the sensing transistor to erase data.

A well electrode 195 may be formed at an upper portion of the fourth doping layer 134. More specifically, well electrodes 195a and 195b may be formed at upper portions of the fourth doping layers 134a and 134b, respectively.

In another example, the first type lower well 110, the first type well 112, and the first and second wells 121 and 122 may be formed in random order. For example, the first type well 112 is formed, and then the first and second wells 121 and 122 may be formed within the first type well 112. For another example, the first and second wells 121 and 122 are separately formed, and then the first type well 112 may be formed to enclose each of the first and second wells 121 and 122. Therefore, even if a process is performed in random order, the single poly non-volatile memory device 100 may be implemented to have a corresponding configuration.

In an example, the single poly non-volatile memory device 100 is not always limited thereto and may implement a first type into an N type and implement a second type into a P type. FIG. 1 is merely used for describing an example of the present invention and the scope of the present invention is not limited thereto.

Figure 2A:
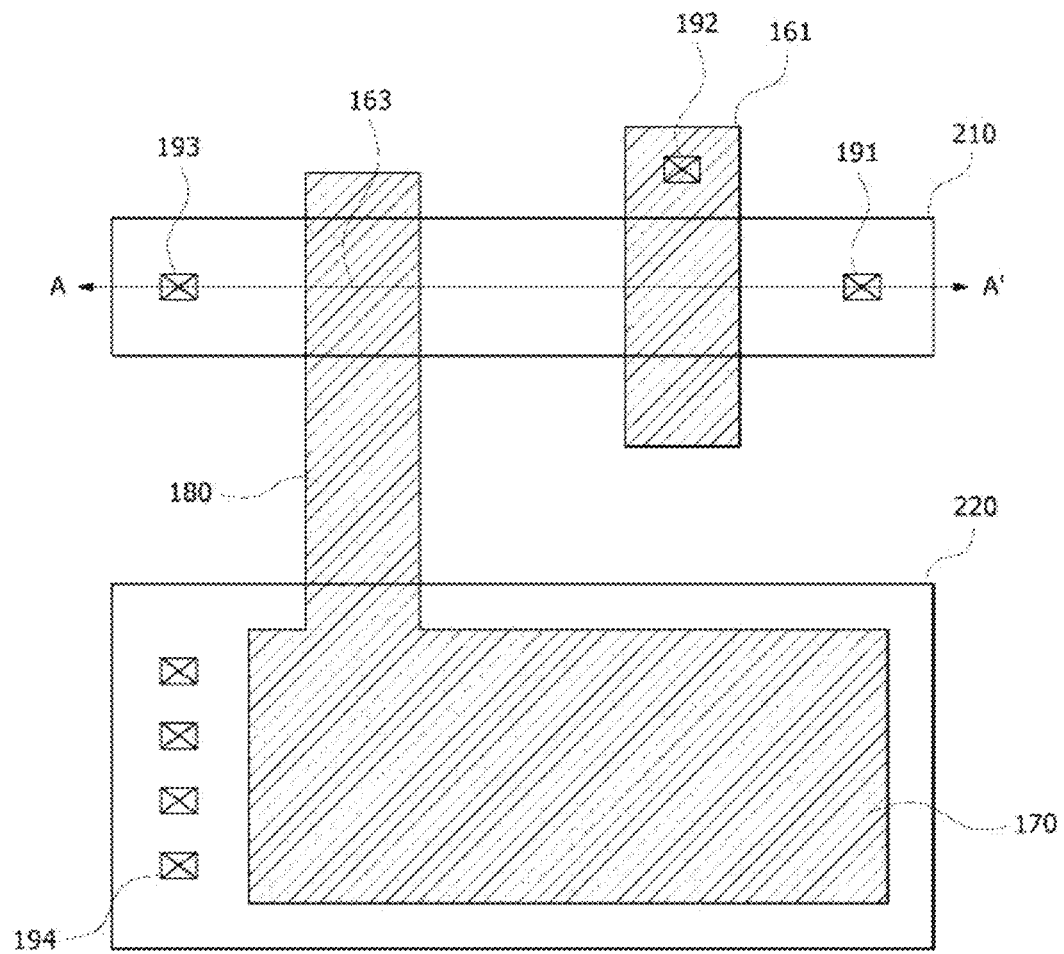
FIGS. 2A and 2B are views illustrating a plane and a cross-section of the single poly non-volatile memory device of FIG. 1.
Figure 2B:
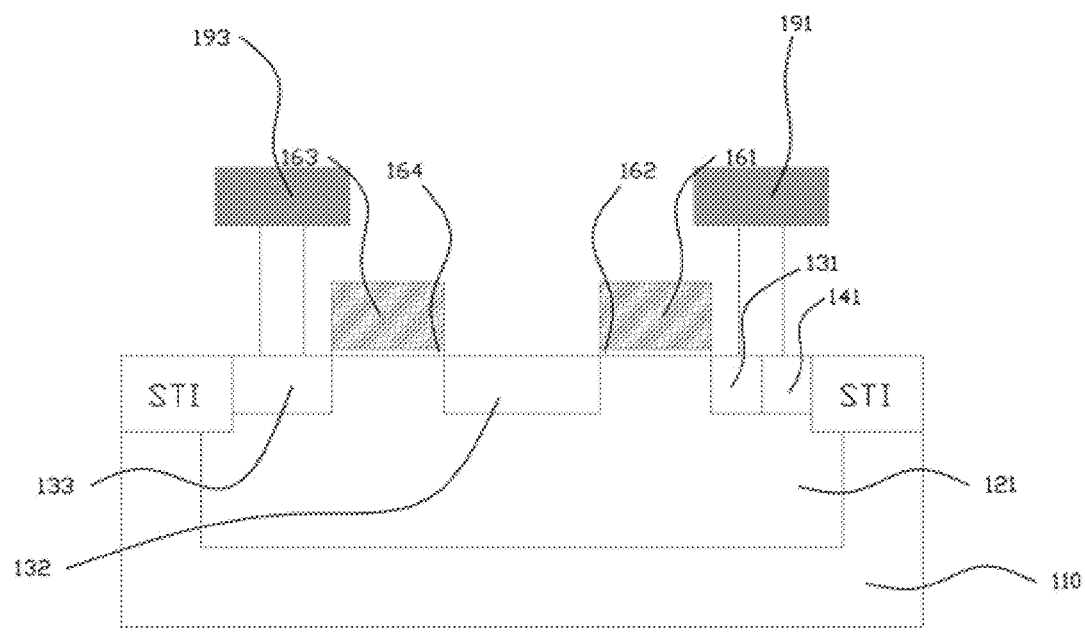

FIG. 2 is a view illustrating a memory cell of the single poly non-volatile memory device of FIG. 1. More specifically, FIG. 2A is a top plan view illustrating the single poly non-volatile memory device of FIG. 1 and FIG. 2B is a cross-sectional view illustrating a transistor area 150 of the single poly non-volatile memory device taken along line A-A' of FIG. 2A.

Referring to FIG. 2, the single poly non-volatile memory device 100 may include first and second active areas 210 and 220. In the first active area 210, the first well 121 may be formed, and at an upper portion thereof, the source electrode 191, the gate 161 of the selection transistor, the gate 163 of the sensing transistor, and the drain electrode 193 may be sequentially disposed within the first active area 210.

In an example, the floating gate 180 may be formed via the first and second active areas 210 and 220 to connect the control gate 170 and the gate 163 of the sensing transistor. The floating gate 180 may be formed at the same plane as that of the control gate 170 and may charge and discharge electric charges to and from the floating gate 180 according to a voltage applied to the control gate electrode 194 and the source electrode 191.

In an example, the first doping layer 131 and the first diffusion area 141 may be connected to the source electrode 191. More specifically, the first doping layer 131 and the first diffusion area 141 may share the source electrode 191 within the first active area 210. Therefore, the source electrode 191 performs an electrical voltage transfer function for performing program-erase through the first doping layer 131 and the first diffusion area 141. The source electrode 191 may share a source area of the selection transistor through the first doping layer 131. By adjacently disposing the first doping layer 131 and the first diffusion area 141 within one active area, the single poly non-volatile memory device 100 can reduce an area thereof while maintaining an electrical function.

In an example, the second doping layer 132 may share a drain area of the selection transistor and a source area of the sensing transistor. The single poly non-volatile memory device 100 may omit a terminal between the drain area of the selection transistor and the source area of the sensing transistor through the second doping layer 132. That is, the single poly non-volatile memory device 100 may reduce an area thereof through the second doping layer 132.

In an example, in the memory cell 150, the source electrode 191, the gate 161 of the selection transistor, and the gate 163 of the sensing transistor, and the drain electrode 193 may be sequentially disposed. The sensing transistor 820 may be separated far from the source electrode 191 to increase erase efficiency and improve an operation margin, compared with a case in which the sensing transistor is disposed adjacent to the source electrode 191. Here, an operation margin may correspond to the difference between a program voltage and an erase voltage. In the single poly non-volatile memory device 100, as an operation margin increases, the number of program and erase operations of data may increase. Hereinafter, improvement of an operation margin will be described in detail with reference to FIG. 4.

In an example, the sensing transistor may be implemented into a tunneling area. That is, in the sensing transistor, in a program or erase process of data, electrons may be discharged or injected. The single poly non-volatile memory device 100 may form the sensing transistor and a tunneling area at the same space to reduce an area thereof.

In the second active area 220, the second well 122 is formed, and at an upper portion, the control gate 170 is formed. Further, the second well 122 is separately formed from the first active area 210. In an example, the second active area 220 may house an entire area of the control gate 170 and the control gate electrode 194 to improve operation efficiency of the control gate 170. More specifically, in the single poly non-volatile memory device 100, by disposing an entire area of the control gate 170 within the second active area 220, an unnecessary voltage can be prevented from being transferred to the control gate 170 upon programing or erasing data. Therefore, in the single poly non-volatile memory device 100, a gate area of the outside of the second active area 220 of the control gate 170 can be reduced and program or erase efficiency of data can be improved.

Figure 3A:
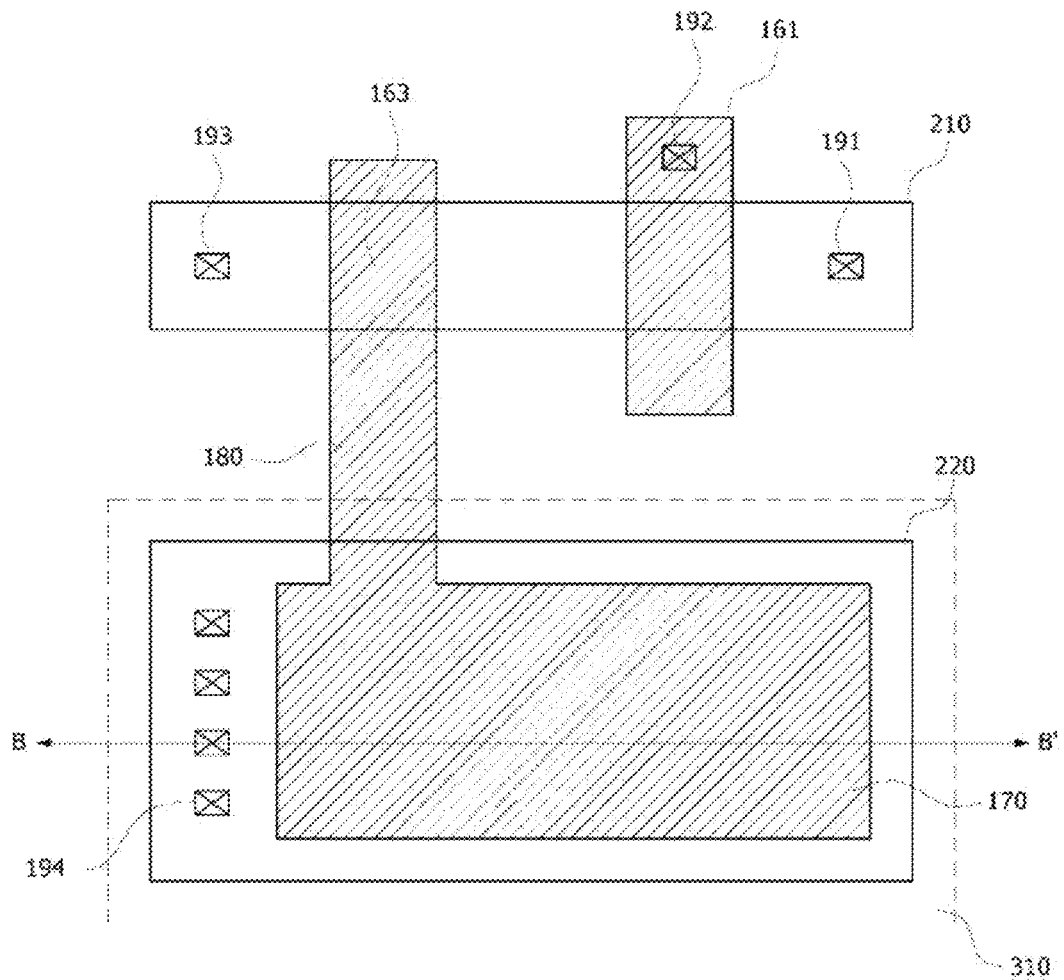
FIGS. 3A and 3B are views illustrating a plane and a cross-section of the single poly non-volatile memory device of FIG. 1.
Figure 3B:
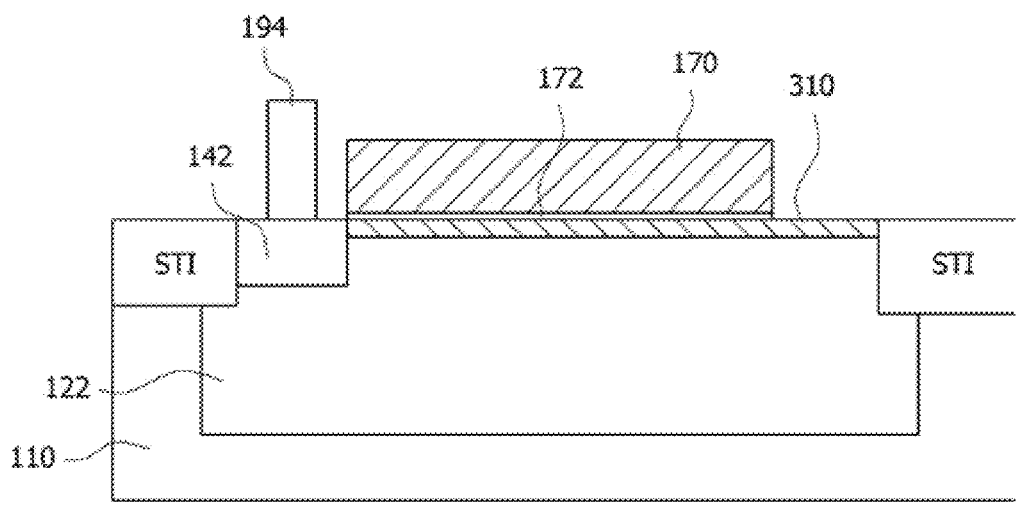

FIG. 3 is a diagram illustrating a control gate of the single poly non-volatile memory device of FIG. 1. More specifically, FIG. 3A is a top plan view illustrating the single poly non-volatile memory device of FIG. 1, and FIG. 3B is a cross-sectional view illustrating the second well 122 of the single poly non-volatile memory device taken along line B-B' of FIG. 3A.

Referring to FIG. 3, the single poly non-volatile memory device 100 may further include an implant area 310 formed at an upper portion of the second well 122 to be disposed at the lower end of the control gate 170. More specifically, the implant area 310 may be disposed parallel to the control gate 170 or wider than the control gate 170 at the lower end of the control gate 170. A third insulating layer 172 may be formed between the control gate 170 and the implant area 310. Here, the implant area 310 may be disposed at an upper end portion of the second well 122 to improve an operation margin of the control gate 170 and to increase the program and erase number of data.

In an example, the implant area 310 is not always limited thereto, but may be formed by injecting boron (B+) having the concentration of 3.5E12 with energy of 25 KeV and indium (In+) having the concentration of 4.3E12 with energy of 170 KeV. Injection of boron (B+) and indium (In+) into the implant area 310 is performed while forming the second well 122 and may be thus performed without a separate addition mask for the single poly non-volatile memory device. That is, while the second well 122 is formed, the implant area 310 is formed and thus a separate process is not required.

Figure 4:
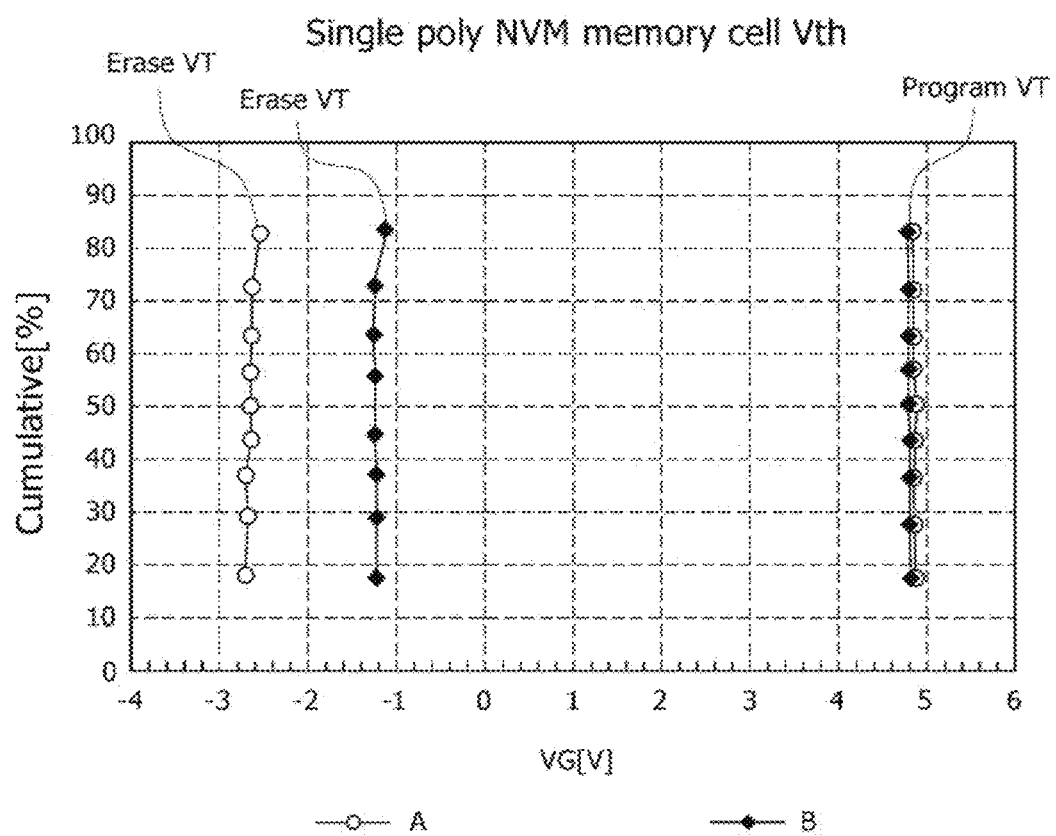
FIG. 4 is a graph illustrating a program voltage and erase voltage distribution of the single poly non-volatile memory device of FIG. 1.

FIG. 4 is a graph illustrating a program voltage and an erase voltage of the single poly non-volatile memory device of FIG. 1. More specifically, FIG. 4 is a graph illustrating improvement of erase efficiency of a single poly non-volatile memory device in which a source electrode, a selection transistor, a sensing transistor, and a drain electrode are sequentially disposed.

Referring to FIG. 4, in the single poly non-volatile memory device 100, the source electrode 191, the selection transistor 810, the sensing transistor 820, and the drain electrode 193 may be sequentially disposed on the first well 121. A case A in which the sensing transistor 820 is disposed far separately from the source electrode 191 can increase erase efficiency and improve an operation margin further than a case B in which the sensing transistor is disposed adjacent to the source electrode 191. That is, the single poly non-volatile memory device 100 can reduce an erase voltage by about 1.5V further than a case B of disposing the sensing transistor 820 adjacent to the source electrode 191. That is, the single poly non-volatile memory device 100 can secure an operation margin corresponding to about 1.5V with only a disposition of the source electrode 191, the selection transistor 810, the sensing transistor 820, and the drain electrode 193. That is, in a case A in which the source electrode 191 is disposed far separately from the sensing transistor, erase efficiency can be improved.

Figure 5:
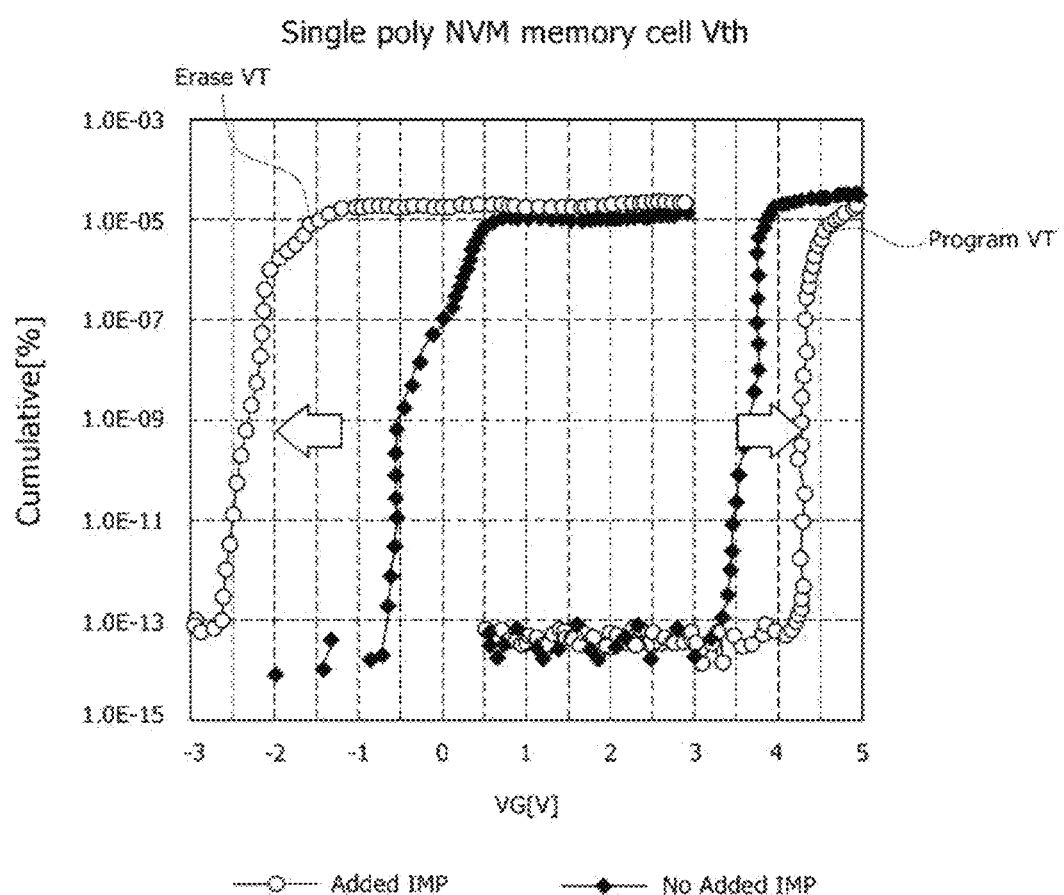
FIG. 5 is a graph illustrating a program voltage and an erase voltage when an implant area is formed in the single poly non-volatile memory device of FIG. 1.

FIG. 5 is a graph illustrating a program voltage and an erase voltage when an implant area is formed in the single poly non-volatile memory device of FIG. 1.

Referring to FIG. 5, by forming the implant area 310, the single poly non-volatile memory device 100 may increase a program voltage (Program VT, Program Voltage Threshold) by about 0.2V and reduce an erase voltage (Erase VT, Erase Voltage Threshold) by about 2V. That is, by increasing a difference between a program voltage and an erase voltage, the single poly non-volatile memory device 100 can improve an operation margin. That is, when a difference between a program voltage and an erase voltage increases, durability of the single poly non-volatile memory device 100 can be guaranteed. By improving an operation margin, the single poly non-volatile memory device 100 can improve a data retention ability according to the program and erase number of data.

Figure 6A:
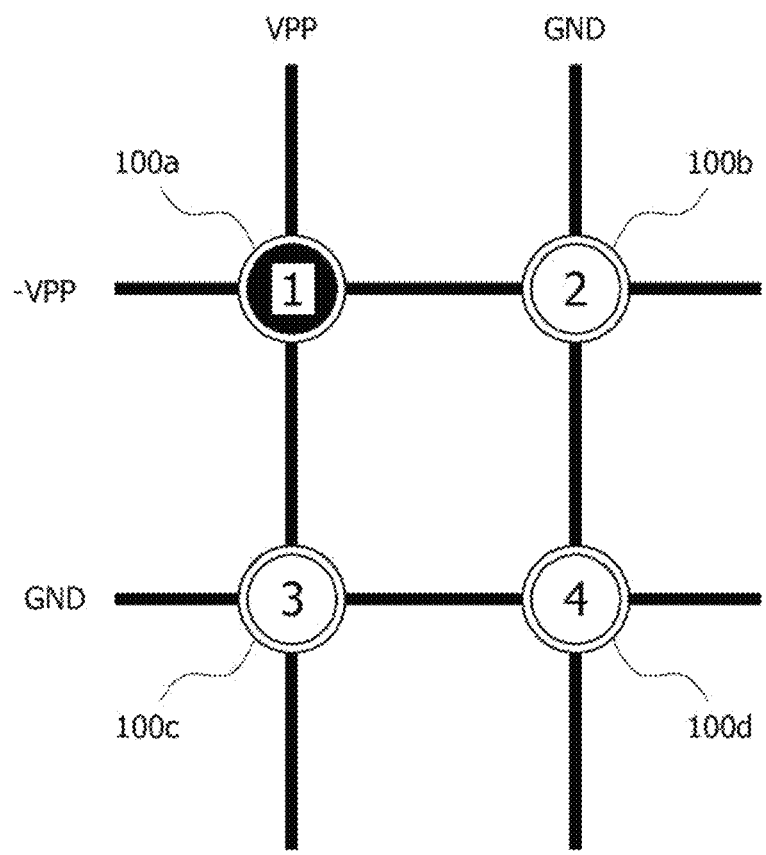
FIGS. 6A and 6B are conceptual diagrams illustrating a method of arranging a single poly non-volatile memory device.
Figure 6B:
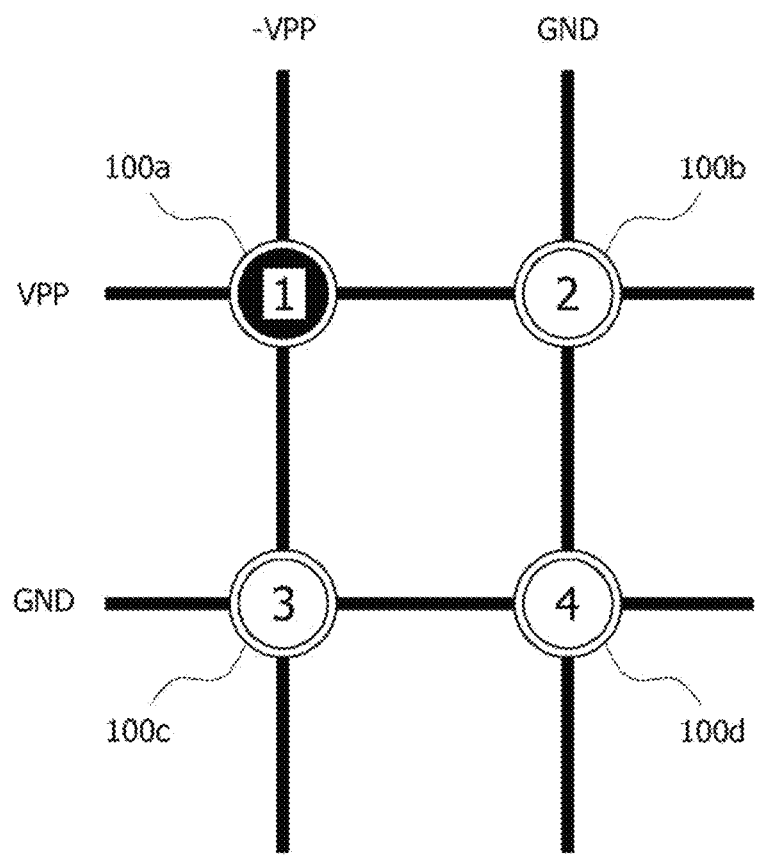

FIG. 6 is a conceptual diagram illustrating a method of arranging a single poly non-volatile memory device.

Referring to FIG. 6, conventionally, when performing a program or erase operation of the first to fourth single poly non-volatile memory devices 100a, 100b, 100c, and 100d, each device may be connected to a programming voltage ($V_{PP}$, $-V_{PP}$) or the ground GND. For a program or erase operation, when a corresponding voltage is applied to the control gate and the source electrode, at least one single poly non-volatile memory device to be a target of program or erase may be selected, and a programming voltage ($+V_{PP}$, $-V_{PP}$) may be applied to the selected at least one single poly non-volatile memory device. A programming voltage ($+V_{PP}$, $-V_{PP}$) or the ground GND may be connected to each of the unselected (or no target of program-erase) single poly non-volatile memory devices.

For example, the first single poly non-volatile memory device 100a may be selected as target of program or erase, and the second to fourth single poly non-volatile memory devices 100b to 100d may not be selected. In this case, a programming voltage ($V_{PP}$, $-V_{PP}$) may be applied to a source electrode and a control gate of the first single poly non-volatile memory device 100a, and a voltage difference between both ends thereof may be $2V_{PP}$. A programming voltage ($+V_{PP}$, $-V_{PP}$) or the ground GND may be connected to each of the second to fourth single poly non-volatile memory devices 100b, 100c, and 100d, and voltage differences applied to each of the second to fourth single poly non-volatile memory devices 100b, 100c, and 100d may be $V_{PP}$, $V_{PP}$, 0, respectively. Therefore, in a conventional method of arranging a single poly non-volatile memory device, a difference occurs between voltages applied to both ends of each of unselected single poly non-volatile memory devices and thus a problem may occur that data of the unselected single poly non-volatile memory devices are changed.

Therefore, in a single poly non-volatile memory device array, one cell formed with a selection transistor 810, a sensing transistor 820, and a control gate 170 is formed in an array form to share a control gate and a source electrode of an adjacent selection transistor, and program and erase operation voltages may be applied to the control gate and the source electrode of the selection transistor.

In an example, in single poly non-volatile memory device arrays, at least one single poly non-volatile memory device to be a target of program or erase may be selected, a programming voltage may be applied to the selected at least one single poly non-volatile memory device, and in order to minimize a voltage difference applied to unselected single poly non-volatile memory devices of a plurality of single poly non-volatile memory devices upon performing a program or erase operation, a portion of a programming voltage may be applied to unselected single poly non-volatile memory devices. For example, a portion of the programming voltage applied to the unselected single poly non-volatile memory devices may be ⅓ of the programming voltage.

Figure 7A:
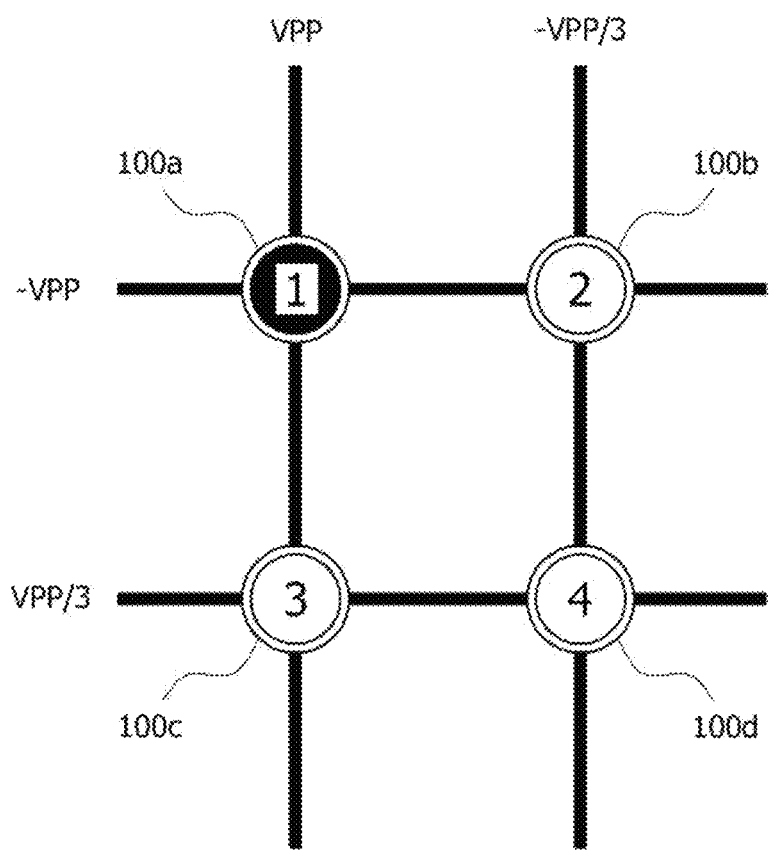
FIGS. 7A and 7B are conceptual diagrams illustrating a method of arranging the single poly non-volatile memory device of FIG. 1 according to an example.
Figure 7B:
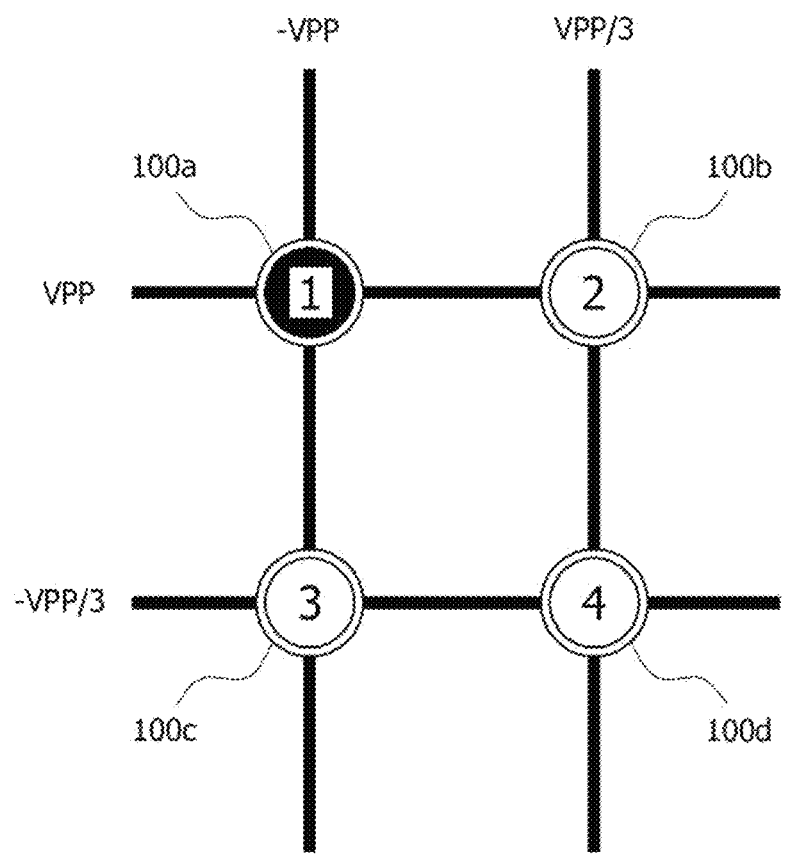

FIG. 7 is a conceptual diagram illustrating a method of arranging the single poly non-volatile memory device of FIG. 1 according to an example. In FIG. 7, for a concept description, four memory devices are arranged, but the number of memory devices is not limited thereto.

Referring to FIG. 7, in a method of arranging the single poly non-volatile memory devices 100 according to an example, each of the first to fourth single poly non-volatile memory devices 100a, 100b, 100c, and 100d may be connected to a programming voltage ($+V_{PP}$, $-V_{PP}$) or a portion ($+V_{PP}/n$, $-V_{PP}/n$) (n is the positive number) of the programming voltage. In a method of arranging the single poly non-volatile memory devices 100, at least one single poly non-volatile memory device to be a target of program or erase may be selected and a programming voltage ($+V_{PP}$, $-V_{PP}$) may be applied to a source electrode and a control gate of the selected at least one single poly non-volatile memory device. In a method of arranging the single poly non-volatile memory devices 100, a programming voltage ($+V_{PP}$, $-V_{PP}$) or a portion ($+V_{PP}/n$, $-V_{PP}/n$) (n is the positive number) of the programming voltage may be connected to each of unselected (or no target of program-erase) single poly non-volatile memory devices.

In an example, in a method of arranging the single poly non-volatile memory devices 100, the first single poly non-volatile memory device 100a may be selected as a target of program or erase and the second to fourth single poly non-volatile memory devices 100b, 100c, and 100d may not be selected. In this case, a programming voltage ($+V_{PP}$, $-V_{PP}$) may be applied to the source electrode and the control gate of the first single poly non-volatile memory device 100a, and a voltage difference between both ends thereof may be $2V_{PP}$. A programming voltage ($+V_{PP}$, $-V_{PP}$) or a ⅓ programming voltage ($+V_{PP}/3$, $-V_{PP}/3$) may be connected to each of the second to fourth single poly non-volatile memory devices 100b, 100c, and 100d, and voltage differences applied to each of the second to fourth single poly non-volatile memory devices 100b, 100c, and 100d may be ⅔$V_{PP}$, ⅔$V_{PP}$, and ⅔$V_{PP}$, respectively. Therefore, when a programming voltage (+$V_{PP}$, −$V_{PP}$) or a ⅓ programming voltage (+$V_{PP}$/3, −$V_{PP}$/3) is applied to a source electrode and a control gate of each of the unselected single poly non-volatile memory devices 100b, 100c, and 100d, the entire voltage difference applied to each of the unselected single poly non-volatile memory devices 100b, 100c, and 100d may be the same.

In more detail, a voltage may be applied to a source electrode and a control gate of the single poly non-volatile memory device 100a that selects a programming voltage (+$V_{PP}$, −$V_{PP}$). That is, when a programming voltage +$V_{PP}$ is applied to the control gate and when a programming voltage −$V_{PP}$ is applied to the source electrode, the selected single poly non-volatile memory device 100a may perform a program operation. In this case, the adjacent unselected single poly non-volatile memory device 100b is commonly connected to a source electrode of the selected single poly non-volatile memory device 100a and thus a programming voltage −$V_{PP}$ is applied thereto. However, when a ⅓ programming voltage −$V_{PP}$/3 is applied to the control gate electrode of the unselected single poly non-volatile memory device 100b, a voltage difference applied to the unselected single poly non-volatile memory device 100b becomes ⅔$V_{PP}$. Similarly, a control gate is commonly connected to the adjacent unselected single poly non-volatile memory device 100c and thus a programming voltage $V_{PP}$ is applied thereto, but when a ⅓ programming voltage $V_{PP}$/3 is applied to the source electrode, a voltage difference applied to the unselected single poly non-volatile memory device 100c becomes ⅔$V_{PP}$. Therefore, a ⅓ programming voltage −$V_{PP}$/3 is applied to a control gate of the automatically unselected single poly non-volatile memory device 100d and a ⅓ programming voltage $V_{PP}$/3 is applied to a source electrode thereof and thus a voltage difference applied to the unselected single poly non-volatile memory device 100d becomes ⅔$V_{PP}$.

In another example, a programming voltage (+$V_{PP}$, −$V_{PP}$) or a voltage (+$V_{PP}$/x, −$V_{PP}$/x) (x is a value approximate to 3) approximate to a ⅓ programming voltage is connected to control gates and source electrodes of each of the unselected single poly non-volatile memory devices 100b, 100c, and 100d, and the entire voltage differences applied to each of the second to fourth single poly non-volatile memory devices 100b, 100c, and 100d may be a value approximate to ⅔$V_{PP}$. In more detail, a voltage may be applied to the source electrode and the control gate of the single poly non-volatile memory device 100a that selects a programming voltage (+$V_{PP}$, −$V_{PP}$). That is, when a programming voltage −$V_{PP}$ is applied to the control gate and when a programming voltage $V_{PP}$ is applied to the source electrode, the selected single poly non-volatile memory device 100a may perform an erase operation. In this case, the adjacent unselected single poly non-volatile memory device 100b is commonly connected to a source electrode of the selected single poly non-volatile memory device 100a and thus a programming voltage $V_{PP}$ is applied thereto. However, when a voltage +$V_{PP}$/x (x is a value approximate to 3) approximate to a ⅓ programming voltage is applied to the control gate of the unselected single poly non-volatile memory device 100b, a voltage difference applied to the unselected single poly non-volatile memory device 100b becomes a value approximate to ⅔$V_{PP}$.

A voltage difference applied to the unselected single poly non-volatile memory devices 100c and 100d with this method becomes a value approximate to ⅔$V_{PP}$.

Therefore, in a method of arranging a single poly non-volatile memory device according to the present invention, a voltage difference applied to both ends of each of unselected single poly non-volatile memory devices can be removed or a voltage difference can be reduced to a much smaller value. Further, in a method of arranging a single poly non-volatile memory device, reliability of programed data can be improved, the cycling number of a memory evice can increase, and disturbance between unselected single poly non-volatile memory devices can be prevented.

Figure 8:
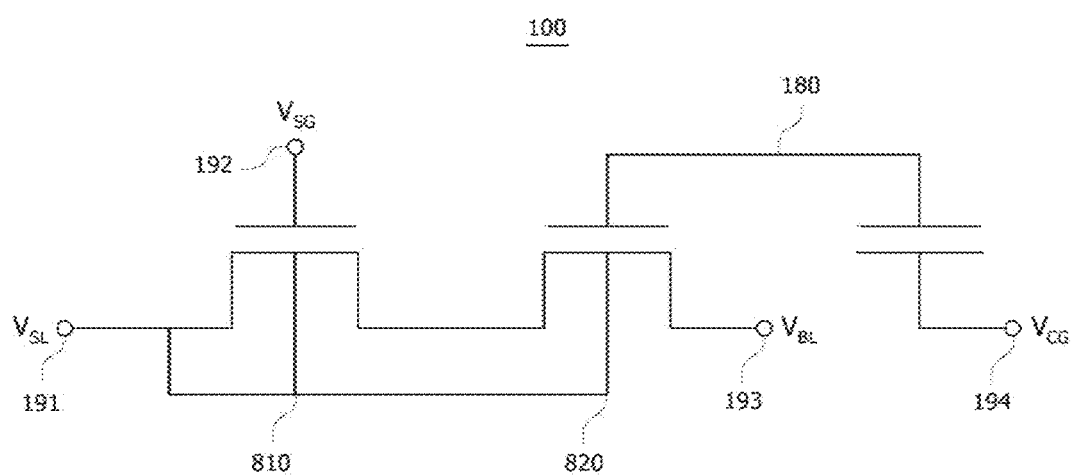
FIG. 8 is a circuit diagram illustrating the single poly non-volatile memory device of FIG. 1.
Figure 9:
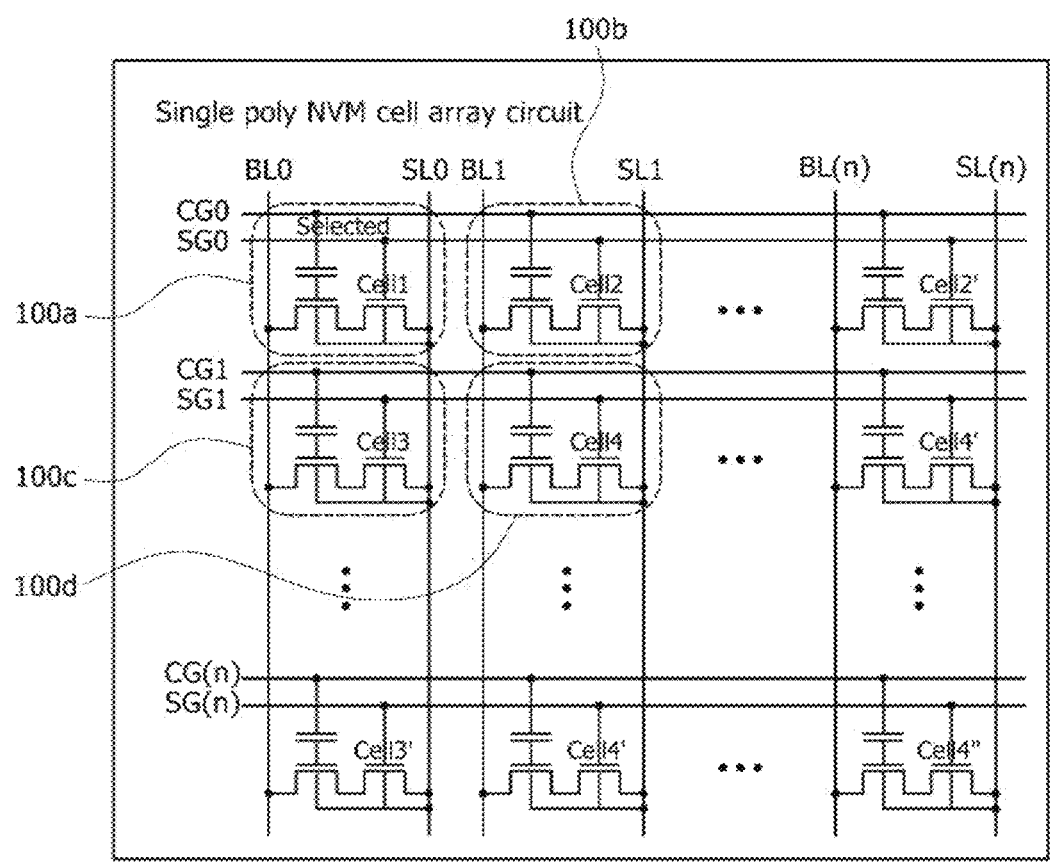
FIG. 9 is a circuit diagram illustrating single poly non-volatile memory devices arranged with a method of arranging a single poly non-volatile memory device of FIGS. 7A and 7B.

FIG. 8 is a circuit diagram illustrating the single poly non-volatile memory device of FIG. 1, and FIG. 9 is a circuit diagram illustrating single poly non-volatile memory devices arranged with a method of arranging a single poly non-volatile memory device of FIG. 7.

Referring to FIGS. 8 and 9, a plurality of single poly non-volatile memory devices 100 may be connected in parallel. For example, one column of single poly non-volatile memory devices 100 may receive the same drain voltage VBL and source voltage VSL. That is, the drain electrode 193 and the source electrode 191 of one column of single poly non-volatile memory devices 100 may be connected. A selection transistor 810 may be turned on or turned off through a voltage applied to the selection gate electrode 192. The sensing transistor 820 may be tunneled according to a voltage difference between the control gate electrode 194 and the source electrode 191. Further, one row of single poly non-volatile memory devices 100 may receive the same control gate voltage VCG and selection gate voltage VSG. That is, the control gate electrode 194 and the selection gate electrode 192 of one row of single poly non-volatile memory devices 100 may be connected.

In an example, a plurality of single poly non-volatile memory devices 100 may receive a programming voltage (+$V_{PP}$, −$V_{PP}$) or a ⅓ programming voltage (+$V_{PP}$/3, −$V_{PP}$/3) through the drain electrode 193, the source electrode 191, the control gate electrode 194, and the selection gate electrode 192.

Figure 10A:
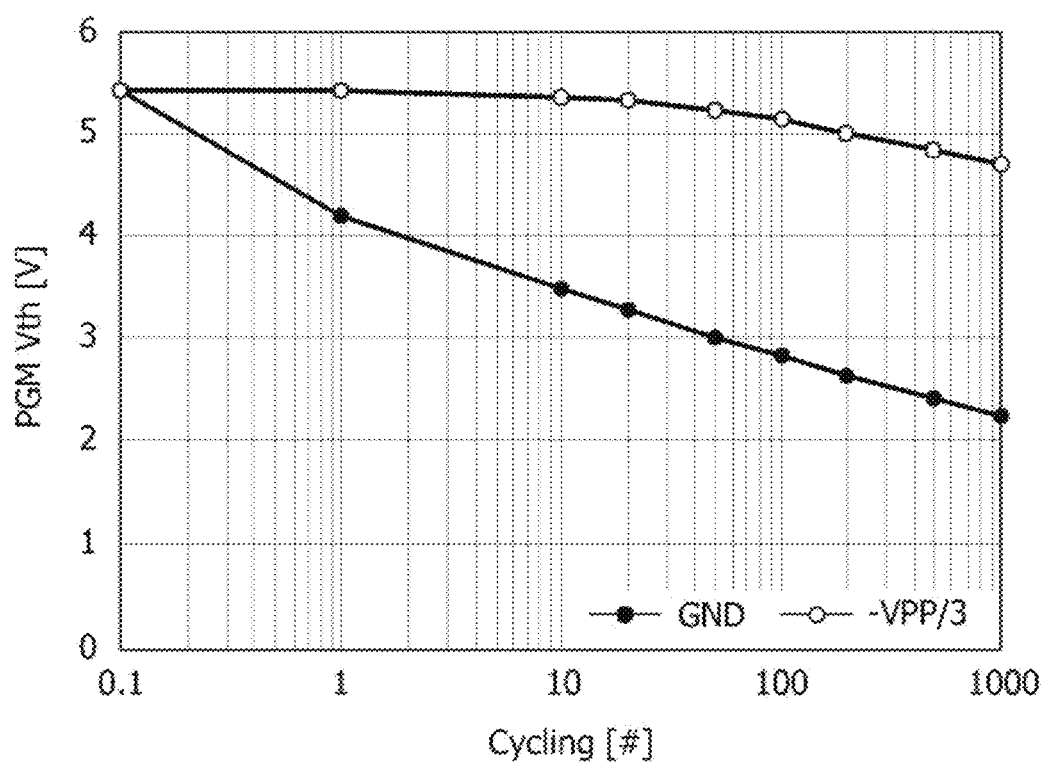
FIGS. 10A and 10B are graphs illustrating a performance of single poly non-volatile memory devices arranged with a method of arranging a single poly non-volatile memory device of FIGS. 7A and 7B.
Figure 10B:
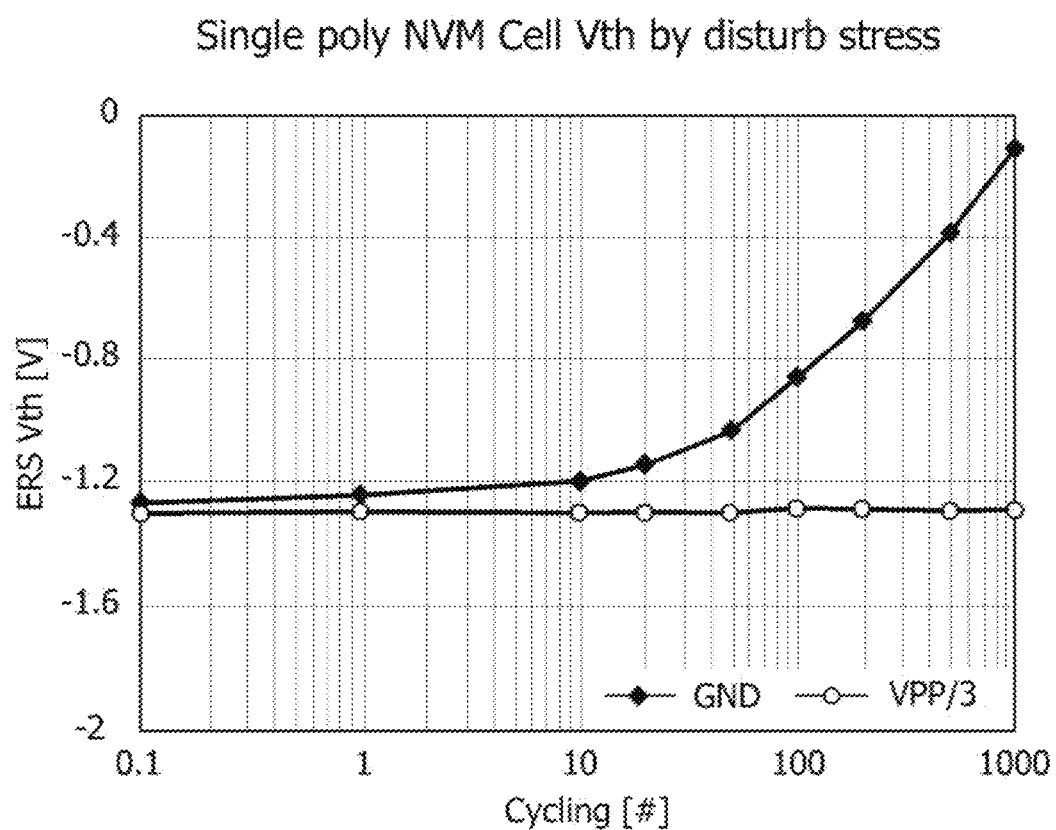

FIG. 10 is a graph illustrating a performance of single poly non-volatile memory devices arranged with a method of arranging a single poly non-volatile memory device of FIG. 7.

Referring to FIG. 10, a method of arranging a single poly non-volatile memory device increases the cycling number, compared with technology that connects unselected single poly non-volatile memory devices to the ground GND. More specifically, when the cycling number increases, a problem occurs that a program threshold voltage PGM $V_{TH}$ or an erase threshold voltage ERS $V_{TH}$ of an unselected single poly non-volatile memory device changes and thus data stored at the single poly non-volatile memory device may be changed. However, as described with reference to FIGS. 7A and 7B, in a method of applying a voltage approximate to ⅓ programming voltage instead of the ground GND to a source electrode and a control gate of the unselected single poly non-volatile memory devices, even if the cycling number arrives at 1000 or more, a program threshold voltage PGM $V_{TH}$ and an erase threshold voltage ERS $V_{TH}$ do not almost change and thus stored data can be stably maintained.

Therefore, the single poly non-volatile memory device 100 may dispose the selection transistor and the sensing transistor at the first well 121 and dispose the control gate 170 at the second well 122 separated from the first well 121. The single poly non-volatile memory device 100 may sequentially dispose the source electrode 191, the selection transistor, the sensing transistor, and the drain electrode 193 at the first well 121 and may form an entire area of the control gate 170 and the control gate electrode 194 within the second active area 220. Further, the single poly non-volatile memory device 100 may form the second doping layer 132 that shares a drain area of the selection transistor and a source area of the sensing transistor. Resultantly, the single poly non-volatile memory device 100 can improve program and erase operation efficiency and reduce an area of a memory device.

Figure 11:
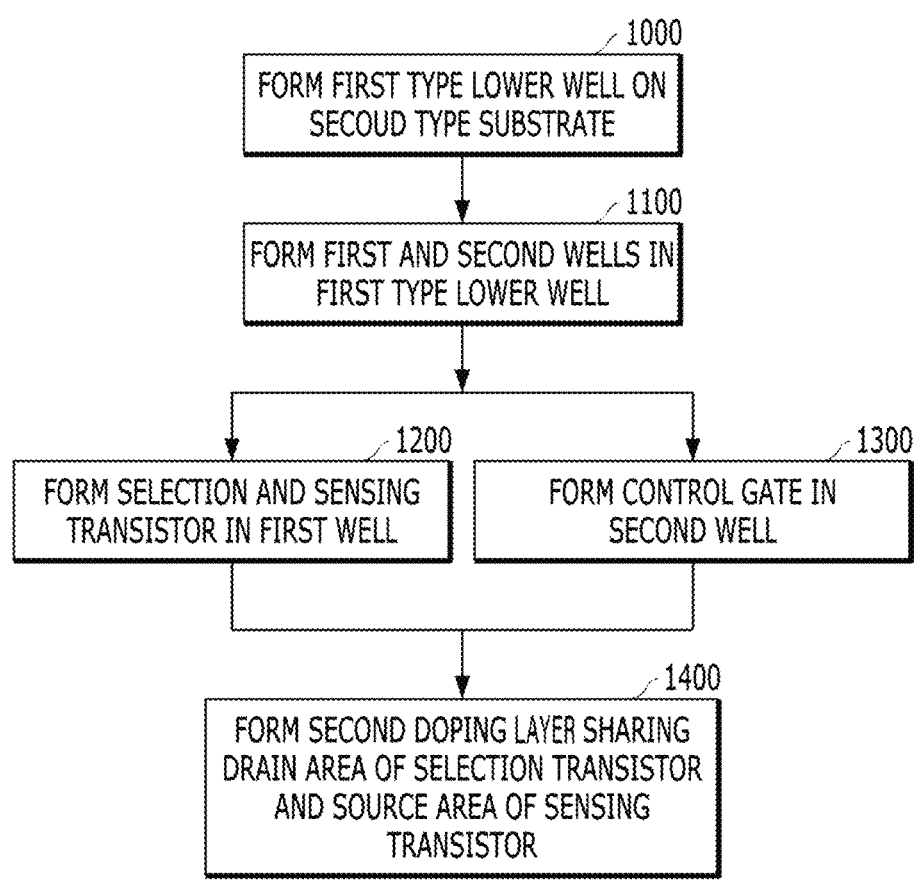
FIG. 11 is a diagram illustrating an example of a method of manufacturing a single poly non-volatile memory device illustrated in FIGS. 1A and 1B.

FIG. 11 is a diagram illustrating an example of a method of manufacturing a single poly non-volatile memory device illustrated in FIGS. 1A and 1B.

Referring to FIG. 11, in step 1000 a first type lower well 110 is formed on the second type substrate 10. By doping and diffusing first type impurities in the second type substrate 10, the first type lower well 110 may be formed from an upper portion of the lower well 110 to a surface of an active area.

In step 1100 the first and second wells (121 and 122) are formed in the first type lower well 110. By doping first type or second type impurities in the first type lower well 110, the first and second wells 121 and 122 may be formed.

The first and second wells 121 and 122 may be separately formed in an upper portion of the first type lower well 110. The first and second wells 121 and 122 each may correspond to a first or second active area. The first or second active area may be separated by the insulating layer 120.

In step 1200, the selection transistor 810 and sensing transistors 820 are formed in the first well 121. As illustrated in FIG. 11, steps 1200 and 1300 may occur simultaneously.

In step 1300, a control gate 170 may be formed in an upper portion of the second well 122 separated on an opposite side of the source electrode 191 from the first well 121. Further in step 1400, a second doping layer 132 that shares a drain area of the selection transistor 810 and a source area of the sensing transistor 820 may be formed. The single poly non-volatile memory device 100 may omit a terminal between the drain area of the selection transistor and the source area of the sensing transistor through the second doping layer 132. In this manner, the single poly non-volatile memory device 100 may reduce an area thereof through the second doping layer 132.

Although examples of the present disclosure have been described in detail hereinabove, it should be clearly understood that many variations and modifications of the basic inventive concepts herein described, which may appear to those skilled in the art, will still fall within the spirit and scope of the examples of the present disclosure as defined in the appended claims.

What is claimed is:

1. A single poly non-volatile memory device array, comprising:
a cell comprising a source electrode, a gate of a selection transistor, a drain region of the selection transistor, a gate of a sensing transistor, a source region of the sensing transistor, and a drain electrode sequentially formed on a first well, and
a control gate formed on a second well,
wherein the control gate on the second well is connected to the gate of the sensing transistor on the first well, and
wherein the drain region of the selection transistor shares the source region of the sensing transistor.

2. The single poly non-volatile memory device array of claim 1, wherein a single poly non-volatile memory device to be a target of program or erase is selected from the single poly non-volatile memory device array, and a programming voltage is applied to the selected single poly non-volatile memory device, and
wherein a portion of the programming voltage is applied to unselected single poly non-volatile memory devices in order to minimize a voltage difference applied to the unselected single poly non-volatile memory devices among the single poly non-volatile memory devices upon performing a program operation or an erase operation.

3. The single poly non-volatile memory device array of claim 2, wherein the portion of the programming voltage applied to the unselected single poly non-volatile memory devices corresponds to $\frac{1}{3}$ of the programming voltage.

4. A single poly non-volatile memory device, comprising:
a first type lower well;
first and second wells disposed in the first type lower well and separated from each other;
a source electrode, a gate of a selection transistor, a gate of a sensing transistor, and a drain electrode sequentially disposed on the first well; and
a control gate formed on the second well and connected to the gate of the sensing transistor,
wherein program and erase operation voltages are applied to the control gate and the source electrode, respectively.

5. The single poly non-volatile memory device of claim 4, wherein the single poly non-volatile memory device to be a target of program or erase is selected from the single poly non-volatile memory device array, and a programming voltage is applied to the selected single poly non-volatile memory device, and
wherein a portion of the programming voltage is applied to unselected single poly non-volatile memory devices minimizing a voltage difference applied to the unselected single poly non-volatile memory devices among the single poly non-volatile memory devices upon performing a program operation or an erase operation.

6. The single poly non-volatile memory device of claim 5, wherein the portion of the programming voltage applied to the unselected single poly non-volatile memory devices corresponds to $\frac{1}{3}$ of the programming voltage.

7. The single poly non-volatile memory device array of claim 1, wherein the control gate is connected to the gate of the sensing transistor through a floating gate.

8. The single poly non-volatile memory device array of claim 7, wherein the floating gate is configured to charge electric charges to program data.

9. The single poly non-volatile memory device array of claim 7, wherein the floating gate is configured to discharge electric charges to erase data.

10. The single poly non-volatile memory device array of claim 1, wherein program and erase operation voltages are applied to the control gate and the source electrode.

11. The single poly non-volatile memory device array of claim 1, further comprising:
a first type lower well in which the first well and the second well are formed; and
a first trench insulating layer formed in the first type lower well to separate the first well and the second well.

12. The single poly non-volatile memory device array of claim 1, further comprising:
a source region of the selection transistor formed in the first well; and
a drain region of the sensing transistor formed in the first well.

13. The single poly non-volatile memory device array of claim 12, further comprising a first diffusion area formed in the first well and abutting against the source region of the selection transistor.

14. The single poly non-volatile memory device array of claim 13, further comprising an implant area formed at an upper portion of the second well,
wherein the implant area and the second well have a same conductivity type.

15. The single poly non-volatile memory device array of claim 14, further comprising a second diffusion area formed at one side of the upper portion of the second well,
wherein the implant area abuts against the second diffusion area.

16. The single poly non-volatile memory device array of claim 1, wherein the control gate has an area greater than an area of the gate of the selection transistor or an area of the gate of the sensing transistor in plan view.

* * * * *